United States Patent [19]
Hirai et al.

[11] Patent Number: 5,591,492
[45] Date of Patent: Jan. 7, 1997

[54] PROCESS FOR FORMING AND ETCHING A FILM TO EFFECT SPECIFIC CRYSTAL GROWTH FROM ACTIVATED SPECIES

[75] Inventors: Yutaka Hirai, Hikone; Jinsho Matsuyama; Shigeru Shirai, both of Nagahama, all of Japan

[73] Assignee: Canon Kabushiki Kaisha, Tokyo, Japan

[21] Appl. No.: 396,065

[22] Filed: Feb. 28, 1995

Related U.S. Application Data

[63] Continuation of Ser. No. 193,632, Feb. 8, 1994, abandoned, which is a continuation of Ser. No. 3,938, Jan. 15, 1993, abandoned, which is a continuation of Ser. No. 690,330, Apr. 26, 1991, abandoned, which is a continuation of Ser. No. 341,263, Apr. 21, 1989, abandoned, which is a continuation of Ser. No. 37,958, Apr. 13, 1987, abandoned.

[30] Foreign Application Priority Data

Apr. 11, 1986 [JP] Japan ................................ 61-83924
Apr. 14, 1986 [JP] Japan ................................ 61-85507
Apr. 14, 1986 [JP] Japan ................................ 61-85508
Apr. 15, 1986 [JP] Japan ................................ 61-86825

[51] Int. Cl.⁶ ................................ B05D 3/00; H05H 1/02; C30B 28/14
[52] U.S. Cl. ................................ 427/563; 427/574; 427/572; 427/553; 427/554; 117/92; 117/99; 117/103
[58] Field of Search ................................ 427/563, 573, 427/574, 572, 583, 595, 596, 553, 554; 117/88, 91, 92, 99, 100, 103, 108, 93, 102

[56] References Cited

U.S. PATENT DOCUMENTS 4,226,898 10/1980 Ovshinsky et al. ................ 427/39
4,401,687 8/1983 Rosler et al. ................ 427/38
4,409,605 10/1983 Ovshinsky et al. ................ 357/2
4,422,897 12/1983 Horwitz ................ 427/38

(List continued on next page.)

FOREIGN PATENT DOCUMENTS 0241311 10/1987 European Pat. Off. .
1457032 9/1966 France .
3429899 3/1985 Germany .
3525211 1/1986 Germany .
59-61124 4/1984 Japan ................ 427/572
60-058616 8/1985 Japan .
60-152023 12/1985 Japan .

OTHER PUBLICATIONS

Patent Abstracts of Japan, vol. 910, 189 (E–333) [1912] Aug. 6, 1985.
L. Jastrzebski, "Growth Process of Silicon Over SiO2 by CVD: Epitaxial Lateral Overgrowth Technique," Journal of Electrochemical Society, vol. 130, No. 7, Jul. 1983, pp. 1571–1580.
K. Tanno et al., "Selective Silicon Epitoxy Using Reduced Pressure Technique," Japanese Journal of Applied Physics, vol. 21, No. 9, Part 2, Sep. 1982, pp. L564–566.

*Primary Examiner*—Marianne Padgett
*Attorney, Agent, or Firm*—Fitzpatrick, Cella, Harper & Scinto

[57] ABSTRACT

A process for forming a deposited film comprises the steps of:

(a) arranging previously a substrate for formation of a deposited film in a film forming space;

(b) forming a deposited film on said substrate by introducing an activated species (A) formed by decomposition of a compound (SX) containing silicon and a halogen and an activated species (B) formed from a chemical substance (B) for film formation which is chemically mutually reactive with said activated species (A) separately from each other into said film forming space to effect chemical reaction therebetween; and (c) exposing the deposited film growth surface to a gaseous substance (E) having etching action on the deposited film to be formed during the film forming step (b) to apply etching action on the deposited film growth surface, thereby effecting preferentially crystal growth in a specific face direction.

6 Claims, 7 Drawing Sheets

U.S. PATENT DOCUMENTS

| | | | |
|---|---|---|---|
| 4,521,447 | 6/1985 | Ovshinsky et al. | 427/39 |
| 4,522,662 | 6/1985 | Bradbury et al. | 148/175 |
| 4,529,474 | 7/1985 | Fujiyama et al. | 427/38 |
| 4,529,475 | 7/1985 | Okano et al. | 427/38 |
| 4,540,466 | 9/1985 | Nishizawa | 427/38 |
| 4,578,142 | 3/1986 | Carboy et al. | 156/612 |
| 4,615,765 | 10/1986 | Levinson et al. | 427/53.1 |
| 4,637,895 | 1/1987 | Ovshinsky et al. | 427/39 |
| 4,657,777 | 4/1987 | Hirooka et al. | 427/39 |
| 4,717,585 | 1/1988 | Ishihara et al. | 427/39 |
| 4,717,586 | 1/1988 | Ishihara et al. | 427/39 |
| 4,726,963 | 2/1988 | Ishihara et al. | 427/39 |
| 4,728,528 | 3/1988 | Ishihara et al. | 427/39 |
| 4,778,692 | 10/1988 | Ishihara et al. | 427/53.1 |
| 4,873,125 | 10/1989 | Matsuyama et al. | 427/248.1 |
| 4,918,028 | 4/1990 | Shirai | 427/572 |
| 5,439,844 | 8/1995 | Sakai | 117/99 |

PROCESS FOR FORMING AND ETCHING A FILM TO EFFECT SPECIFIC CRYSTAL GROWTH FROM ACTIVATED SPECIES

This application is a continuation of application Ser. No. 08/193,632 filed Feb. 8, 1994, now abandoned, which is a continuation of application Ser. No. 08/003,938 filed Jan. 15, 1993, abandoned, which is a continuation of application Ser. No. 07/690,330 filed Apr. 26, 1991, abandoned, which is a continuation of application Ser. No. 07/341,263 filed Apr. 21, 1989, abandoned, which is a continuation of application Ser. No. 07/037,958 filed Apr. 13, 1987, abandoned.

BACKGROUND OF THE INVENTION

1. Field of the Invention

This invention relates to a process for forming a functional deposited film containing silicon, particularly a deposited film of polycrystalline silicon to be used for semiconductor devices, photosensitive devices for electrophotography, line sensors for image input, image pickup devices, etc.

2. Related Background Art

For example, for formation of polycrystalline silicon films, the normal pressure CVD method, the LPCVD method, the plasma CVD method, etc., have been primarily used, and, in general, the LPCVD method has been widely been used and industrialized. However, in the method of the prior art, for example, in the LPCVD method, the substrate temperature is high and glass substrates, etc., which are cheap cannot be used, and deposited film having practically useful characteristics cannot be obtained at a low temperature.

Also, in the plasma CVD method, while there is an advantage in of making the substrate temperature lower than the LPCVD method, its reaction process is complicated, and not a few ambiguities existed in the reaction mechanism.

Also, there are a large number of parameters for formation of a deposited film (e.g. substrate temperature, flow rates and their ratios of gases introduced, pressure during film formation, high frequency power, electrode structure, structure of reaction vessel, evacuation speed, plasma generation system, etc.). The plasma formed by combination of such a large number of parameters may sometimes become unstable to give many especially bad properties to the deposited film formed. Besides, in the plasma CVD method, it is difficult to avoid damages by collision of ions or electrons against the film which is an obstacle against obtaining a film of good quality.

As described above, in formation of a silicon film having polycrystallinity, it has been desired to develop a method for forming a polycrystalline silicon film of good quality with a large area by means of a device of low cost while maintaining its practically useful characteristics and uniformness. These are also applicable to other functional films such as silicon carbide films, silicon nitride films, silicon oxide films, etc.

SUMMARY OF THE INVENTION

The present invention provides a novel process for formation of a polycrystalline deposited film which removes the problems of the plasma CVD method as described above without use of the formation method of the prior art.

Another object of the present invention is to provide a process for forming a polycrystalline deposited film which is suitable for enlargement of the film and can easily accomplish improvement of productivity and bulk production of the film, while simultaneously attempting to improve the characteristics of the film formed, the film forming speed and reproducibility and also to uniformize film quality.

According to the present invention, there is provided a process for forming a deposited film, which comprises the step of previously providing a substrate on which a deposited film is to be formed in a film forming space; the step of introducing into the film forming space an activated species (A) formed by decomposition of a compound containing silicon and a halogen and an activated species (B) formed from a chemical substance for film formation which is chemically mutually reactive with said activated species (A) separately from each other and permitting the both species to react chemically with each other thereby to form a deposited film on the substrate; and the step of preferentially effecting, during formation of said deposited film, crystal growth in a specific face direction by subjecting the growing surface of said deposited film to a gaseous material having etching action on said deposited film formed to thereby apply etching action on the growing surface of said deposited film.

DESCRIPTION OF THE PREFERRED EMBODIMENTS

Figure 1:
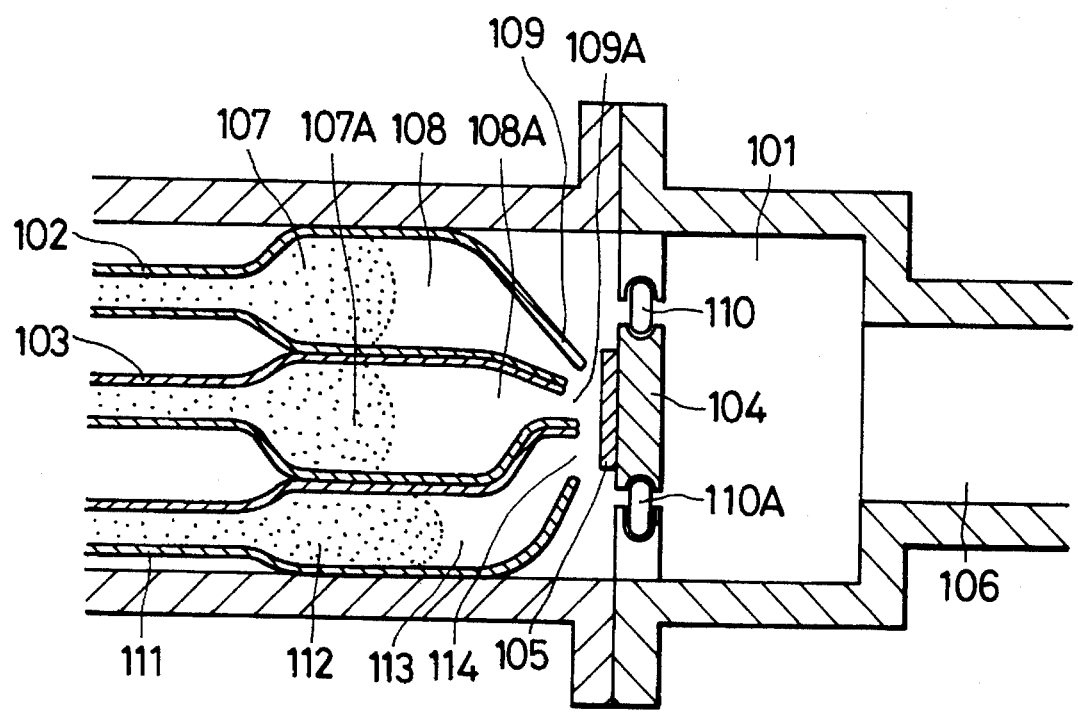
FIG. 1 is a sectional view of the main part of an example of a film forming device for embodying the process for forming a deposited film of the present invention.

The present invention is a process for forming a deposited film, which comprises the step (A) of previously providing a substrate on which a deposited film is to be formed in a film forming space; the step (B) of introducing into the film forming space an activated species (A) formed by decomposition of a compound containing silicon and a halogen and an activated species (B) formed from a chemical substance for film formation which is chemically mutually reactive with said activated species (A) separately from each other and permitting the both species to react chemically with each other thereby to form a deposited film on the substrate; and the step (C) of preferentially effecting, during formation of said deposited film, crystal growth in a specific face direction by subjecting the growing surface of said deposited film to a gaseous material having etching action on said deposited film formed to thereby apply etching action on the growing surface of said deposited film.

In the process of the present invention as described above, in place of exciting plasma in the film forming space for formation of a deposited film, chemical mutual interaction is caused to occur in the co-presence of an active species (A) formed by decomposition of a compound containing silicon and a halogen and an active species (B) formed from a chemical substance for film formation to thereby effect film formation, and therefore a deposited film of good quality can be obtained.

Also, according to the present invention, by controlling the atmosphere temperature in the film forming space and the substrate temperature freely as desired, the CVD method can be made more stable.

One of the points of the process of the present invention different from the CVD process of the prior art is use of activated species which are previously activated in a space different from the film forming space (hereinafter referred to as activation space). By doing so, the film forming speed can be dramatically increased, and also the substrate temperature can be lowered to a great extent. Further, in addition, by introduction of a gaseous material having etching action during the film formation step it has become possible to form a polycrystalline film having only a specific face direction namely a polycrystalline film of good quality with strong orientability and large grain size.

In the present invention, the activated species (A) formed in the activation space (A) should preferebly be selected and used as desired from those having the life of 0.1 sec. or longer, more preferably 1 sec. or longer, optimally 10 sec. or longer, from the standpoint of productivity and easiness in handling, and the constituent elements of the activated species (A) become components constituting the deposited film formed in the film forming space. Also, the chemical substance for film formation is activated by the action of an activation energy in the activation space (B) before introduction into the film forming space and introduced into the film forming space to undergo chemical mutual reaction with the activated species (A) introduced at the same time from activation space (A) and containing constituent elements which become the constituent components of the deposited film formed.

In the present invention, as the compound containing silicon and halogen to be introduced into the activation space (A), there may be employed, for example, chain or cyclic silane compounds of which hydrogen atoms are partially or wholly substituted with halogen atoms, typically chain silicon halides represented by $Si_uY_{2u+2}$ (u is an integer of 1 or more, Y is at least one element selected from F, Cl, Br and I) and cyclic silicon halides $Si_vY_{2v}$ (v is an integer of 3 or more, and Y has the same meaning as defined above), chain or cyclic compounds represented by $Si_uH_xY_y$ (u and Y have the same meanings are defined above, x+y=2u+2).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_3Cl$, $SiH_2Cl_2$, $SiHBr_3$, $SiHI_3$, $Si_2Cl_3F_3$, and the like.

For formation of the activated species (A), in addition to the above compound containing silicon and halogen, single substance of silicon, other silicon compounds, hydrogen, a halogen compound (e.g., $F_2$ gas, $Cl_2$ gas, gasified $Br_2$, $I_2$, etc.) can be used in combination, if desired.

In the present invention, as the method for forming activated species (A) in the activation space (A), there may be employed various activation energies such as electrical energies, including microwave, RF, low frequency, DC, etc., heat energies such as heater heating, IR-ray heating, etc., photoenergy, etc. in view of respective conditions and the device.

As the above chemical substance for film formation for forming activated species (B) in the activation space (B) to be used in the process of the present invention, hydrogen gas and/or a halogen gas (e.g. $F_2$ gas, $Cl_2$ gas, gasified $Br_2$, $I_2$, etc.) may be advantageously used. Also, in addition to these chemical substances for film formation, for example, an inert gas such as helium, argon, neon, etc., may be also employed. When a plural number of these chemical substances for film formation are to be employed, they can be previously mixed and then introduced under gaseous state into the activation space (B), or alternatively these chemical substances for film formation may be fed individually from the respective independent feeding sources to be introduced into the activation space, or they can be introduced into the respective independent activation spaces to be individually activated.

In the present invention, the proportion in amount of the above activated species (A) to the activated species (B) to be introduced into the film forming space may suitably be determined depending on the film forming conditions, the kind of the activated species, etc., but may preferably be 10:1 to 1:10, (introducing flow rates ratio), more preferably 8:2 to 4:6.

Also, the deposited film formed according to the present invention can be doped with the so-called impurity element used in the field of semiconductor during or after film formation. As the impurity element to be used, there may be employed, as p-type impurity, an element belonging to the group IIIA of the periodic table such as B, Al, Ga, In, Tl, etc. and, as n-type impurity, an element belonging to the group VA of the periodic table such as P, As, Sb, Bi, etc. as suitable ones. Particularly, B, Ga, P and Sb are most preferred. The amount of the impurity to be doped may be determined suitably depending on the desired electrical and optical characteristics.

As the substance containing such an impurity atom as the component (substance for introduction of impurity), it is preferably to select a compound which is gaseous under normal temperature and normal pressure, or gaseous at least under the activation conditions film and can be readily gasified by a suitable gasifying device. Such compounds may include $PH_3$, $P_2H_4$, $PF_3$, $PF_5$, $pCl_3$, $AsH_3$, $AsF_5$, $AsCl_3$, $SbH_3$, $SbF_5$, $SiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity element may be used either singly or as a combination of two or more compounds.

The compound containing impurities as element may be directly introduced under gaseous state into the film forming space, or alternatively activated previously in the activation space (A) or the activation space (B) or a third activation space (C) before introduction into the film forming space.

In the present invention, during the film forming step, that is (a) during film formation etching action is applied on the growth surface of the deposited film at the same time, or (b) etching action is applied on the growth surface of the deposited film with film formation intermitted, whereby crystal growth can be effected preferentially in a specific face direction to give a deposited film with good crystallinity. The etching action in the case of the above (b) may be effected within the film forming space or alternatively in an etching space separate from the film forming space.

As the gaseous or readily gasifiable substance for etching (E) having etching action on the deposited film containing silicon, there may be included single substances of halogen, halide compounds or activated species (C) formed from these.

These substances (E) for etching may be introduced under gaseous state into the space where etching action is applied to the deposited film, or alternatively in the case where the substance (E) is formed by the surface reaction on the surface of the deposited film of the above activated species (A) or the above activated species (B), or formed from the chemical reaction between the activated species (A) and the activated species (B), etching action is applied on the growth surface of the deposited film simultaneously with film formation.

For example, as an example in which the substance for etching is formed by the above surface reaction, the reaction between an activated species of halogen and hydrogen or a halogen and activated species of hydrogen occurs on the growth surface of the deposited film, and hydrogen halide (HX) is released from the growth surface of the deposited film and the hydrogen halide becomes the substance (E) for etching.

As the substance (E) having etching action in the present invention, there may be employed halogens such as $F_2$, $Cl_2$, gasified $Br_2$, $I_2$, etc., halogenated carbon such as $CHF_3$, $CF_4$, $C_2F_6$, $CCl_4$, $CBrF_3$, $CCl_2F_2$, $CCl_3F$, $CClF_3$, $C_2Cl_2F_4$, etc., halides including typically boron halides such as $BCl_3$, $BF_3$ and $SF_6$, $NF_3$, $PF_5$, etc., and further radicals such as $F^*$, $Cl^*$, ions such as $CF_3^+$, $CCl_3^+$, from these gases. These can be used also as mixtures, and the etching characteristics can be also controlled by adding $O_2$, $H_2$ and other gases in amounts which do not affect the film.

As the method for etching using the above substance (E), etching and film formation may be repeated alternately by providing separately an etching space, or they can be introduced under the state having etching activity into the film forming space to effect etching action simultaneously with film formation, thereby giving the effect of limiting the growing direction of the crystalline film to accomplish the object of the present invention.

During crystal growth of Si or Si containing substance, there is face direction dependence of growth speed. This may differ depending on the deposited film forming method or deposition conditions, but in the process of the present invention, it has been found that the preferential order is (110)>(111)>(100).

By selecting suitably the kind of the substance (E) for etching and condition of etching under this condition, stronger orientability, namely the condition of (110)>>(111)>>(100) can be realized, whereby it becomes also possible to deposit a polycrystalline film with large grain size which is oriented only in the (110) face direction.

Of course, it is possible to control the orientation face direction depending on the conditions.

Next, the present invention is explained in more detail by referring to a typical example of a film forming device for embodying the present invention.

FIG. 1 is a partial sectional view showing schematic construction of the main part of an example of the deposited film forming device for embodying the process of the present invention.

In FIG. 1, 101 is a deposition chamber in which a silicon thin film is formed, and the deposition chamber 101 is internally connected to an evacuation system not shown through an evacuation outlet 106, whereby the deposition chamber 101 can be internally maintained at a desired pressure.

In the deposition chamber 101, there are a set of an introducing pipe 102 for the radical containing Si and halogen which is the activated species (A) and an introducing pipe 103 for hydrogen radicals which is the activated species (B). The tips of the respective radical introducing pipes are thick at the acting chambers 108, 108A and narrowed at the outlets 109, 109A. Within the deposition chamber 101, a substrate supporting member 104 is held so as to be reciprocally movable in the direction perpendicular to the paper surface by the roller 110. And on the supporting member 104 is held a substrate 105 for deposition. The respective radicals coming out from the outlets 109, 109A are mixed and react with each other in the vicinity of the substrate within the deposition chamber 101 to form a film on the substrate.

The radicals containing silicon and halogen and hydrogen radicals are formed from the respective starting material gases in the radical forming sections such as heating furnaces of plasma chambers, etc. (not shown) respectively, and thereafter introduced through the introducing pipes 102, 103, respectively into the acting chambers 108, 108A. Their amounts are controlled by massflow controllers on the gas source said from the heating furnace or plasma chamber.

Roller 110 is provided for depositing a silicon thin film over the whole surface of the substrate by moving the substrate 105.

The introducing pipe 111 is an introducing pipe for another gas having chemical or physical etching activity, and in some cases the gas is excited in the heating furnace or plasma furnace (not shown) and led to the outlet 114. From the outlet 114, the gas having etching activity for attacking the film is released to cut and exclude selectively bonds other than the bonds in the prescribed growth direction of the film. Introduction of the etching active gas, other than through such separate introduction pipes, can be also done through the introduction pipes 102, 103, mixed with starting gases, when the reactivity with the starting gas is low.

In the process for forming a deposited film of the present invention it is possible to increase the crystal grain size of polycrystal and in its turn to convert it to single crystal by irradiation of an electromagnetic wave such as light or microwave, etc., or electron beam which is a film heating means, or application of heat onto the deposited film at the early stage of the film forming step or during film formation or after film formation.

When the above treatment is effected at the early stage of the film formation step it is preferred to effect it at the state of an extremely thin film of 2000 Å or less, desirably 1000 Å or less. In this case, it is desirable that film formation is once intermitted when a film of 2000 Å or less, desirably 1000 Å or less has been formed, and the grain size of the crystal is enlarged or the polycrystal is converted to single crystal by irradiation of an electromagnetic wave such as light or microwave or electron beam or application of heat to prepare a base film with regular oriented faces. Then, by restarting film formation to form a deposited film with good orientation on the oriented face of the base film, it becomes possible to form a deposited film with enlarged crystal grain size or a single-crystallized deposited film over the whole film with a desired film thickness. By irradiating an electromagnetic wave or electron beam or applying heat on an extremely thin film, enlargement of grain size of crystal or single crystal formation can be effected by lower energy than in the prior art. In this case, since the amount of heat generated is small, damages suffered to the base substrate or diffusion of impurities can be suppressed as compared with the prior art. Also, by film formation on the extremely thin base film subjected to the above treatment, the film surface can also be made flat.

Next, "during film formation" as described above refers to irradiation of an electromagnetic wave such as light or microwave or electron beam or application of heat simultaneously with film formation, and by subjecting only the surface layer of the deposited film to the above treatment, formation of a deposited film with enlarged crystal grain size or a single-crystallized deposited film rendered possible at lower energy than in the prior art. Accordingly, the amount of heat generated is small, and also the damages given to the base plate, etc., and diffusion of impurities are also small, whereby the surface can be made flat. Further, since superfluous hydrogens not contributing to the terminating of the dangling bonds in the film are withdrawn by the halogen or a compound of halogen or its activated species used in the process for forming a deposited film of the present invention, the grain size of crystal is enlarged and the dangling bonds at the crystal grain boundary are effectively terminated with atoms of halogen or hydrogen, whereby the electrical characteristic at the crystal grain boundary can be improved to result in improvement of electrical characteristic of the film as a whole.

The treatment "after the deposition" as described above refers to the time after completion of film formation, and by irradiation of an electromagnetic wave such as light or microwave or electron beam or application of heat at that point, enlargement of the grain size of crystal or single-crystallization can be effected.

Further, in the present invention, the etching effect on the growth surface of the deposited film can be aided by photoenergy irradiation which gives rise to etching selectivity. That is, the substance (E) for etching is optically excited to increase etching activity, which can make crystal growth in a specific direction more efficient. This photoenergy irradiation should preferably be selected so as to act more efficiently on the substance (E) for etching than on the starting gas for film formation.

Next, by referring to the drawings, an example of the method for forming a deposited film of the present invention in the case of depositing a polycrystalline silicon film is described in detail.

Figure 9:
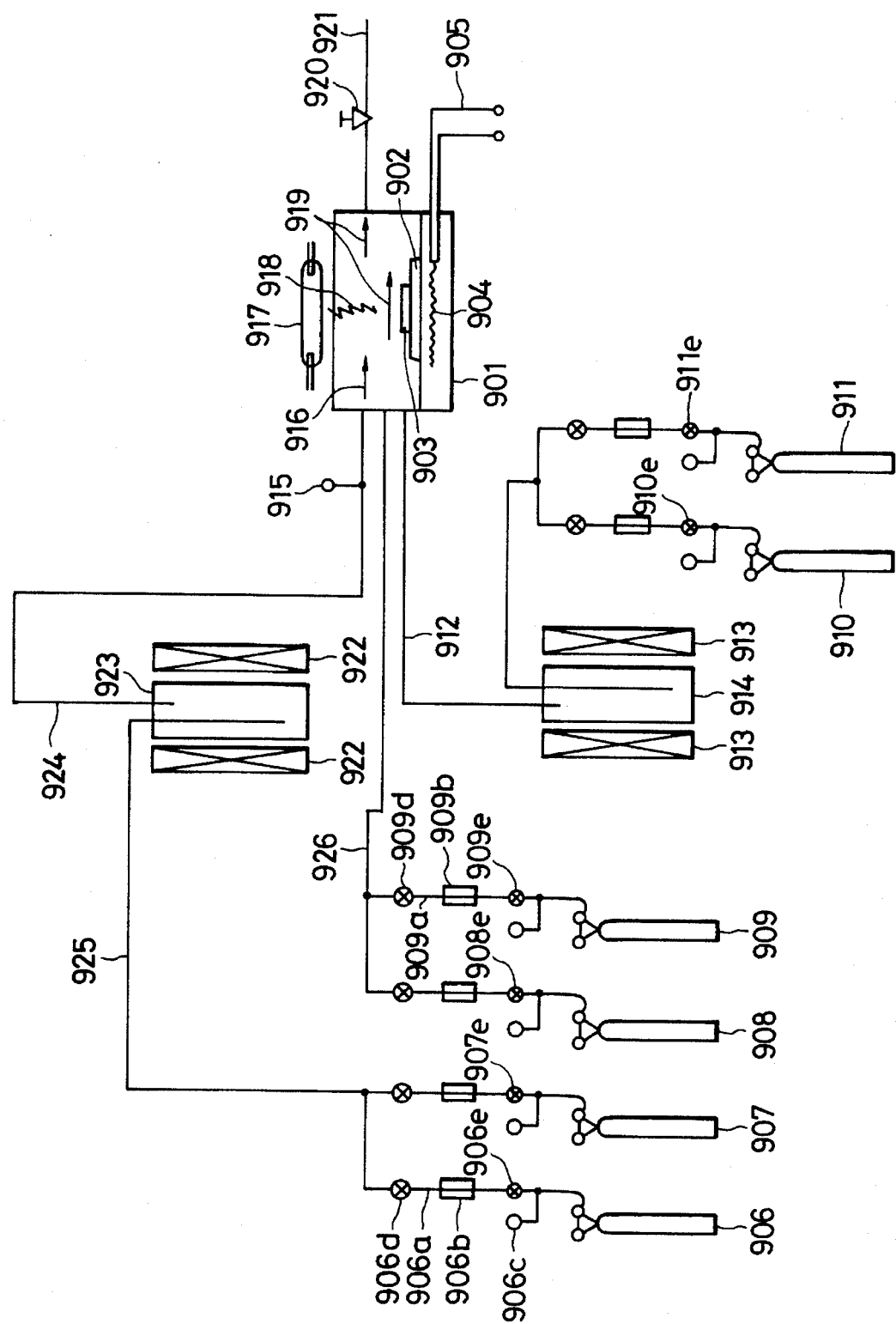
FIG. 9 is a schematic constitutional view of yet another example of a film forming device for embodying the process for forming a deposited film of the present invention.

FIG. 9 is a schematic constitutional view of an example of the device for forming a deposited film for embodying the process of the present invention when photoenergy is subsidiarilly used.

In FIG. 9, 901 is a deposition chamber in which formation of a deposited film such as a polycrystalline silicon film or the like is effected, and the deposition chamber 901 is internally connected to an evacuation system (not shown) through an evacuation pipe 921, whereby the deposition chamber 101 can be internally held at a desired pressure through an evacuation valve 920. The pressure in the deposition chamber 901 is controlled to ordinarily at $10^{-5}$ Torr to 1.0 Torr, preferably at $10^{-4}$ Torr to 0.1 Torr. In the deposition chamber 901, a desired substrate 903 is placed on the substrate supporting stand 902.

904 is a heater for heating the substrate, and electricity is supplied through a conductive wire 905 to generate heat. The substrate temperature is not particularly limited, but it should preferably be 100° to 500° C., more preferably 150° to 400° C., in practicing the process of the present invention.

906 through 911 are gas feeding sources, and provided corresponding to the number of silicon compounds and hydrogen, halogen compound, inert gases, compounds containing impurity elements as the component which may be optionally employed. When liquid type starting material is used, an appropriate gasifying is provided. In the drawing, the symbols of the gas feeding sources 906 through 911 affixed with a show branched pipes, those affixed with b are flow meters, those affixed with c are pressure gauges for measuring the pressures on the higher pressure side, those affixed with d or e are valves for controlling the respective gas flow rates. 912, 925, 926 are gas introducing pipes into the film forming space.

917 is a photoenergy generating device, and for example, mercury lamp, xenon lamp, carbon dioxide laser, argon ion laser, excimer laser, etc., may be employed.

The light 918 directed from the photoenergy generating device 917 by use of a suitable optical system toward the whole of the substrate or a desired portion of the substrate is irradiated on the starting gas, etc., flowing in the direction of the arrowhead 919 to excite the gases, etc., of the film forming starting material and effect the reaction, thereby forming a deposited film of Si on the whole or a desired portion of the substrate 903.

Also, 914 and 923 are activation spaces for forming activated species (A) and activated species (B), respectively, and 913, 922 are each microwave plasma generating device for formation of activated species.

According to the process for forming a deposited film of the present invention using the device such as shown in FIG. 9, it becomes possible to preferentially effect crystal growth in a specific crystal face direction by irradiating the gaseous substance (E) having etching action or decomposed product thereof with photo-energy to thereby increase selectively the etching activity for the deposited film and also by promoting rearrangement of the lattice with a film heating means other than the means for maintaining the substrate temparature.

Further, the photoenergy is imparted uniformly or selectively controllably to the gaseous substance (E) or decomposed product which have reached in the vicinity of the substrate for film formation, and use of photo-energy has conveniences such that a deposited film can be formed by irradiating the whole of a substrate by use of a suitable optical system, or that a deposited film can be formed partially only at a desired portion by selective and controlled irradiation. Also, a deposited film can be formed by irradiation of only a desired pattern portion by use of a resist, etc., and therefore it can be advantageously used.

EXAMPLE 1

A silicon thin film was formed on a substrate of a flat plate glass substrate (#7059), produced by Corning Co.) by means of the device shown in FIG. 1.

By use of $SiF_4$ gas as the starting gas for formation of radicals containing silicon and halogen, this was permitted to flow into the reaction furnace maintained at 1100° C. to be decomposed, followed by release through the introducing pipe 102 into the acting chamber 108. At the same time, $H_2$ gas was permitted to flow into the introducing pipe 103 and a microwave of 2.45 GHz was introduced at a power of 0.5 W/cm$^2$ into said introducing pipe 3 to effect discharging to decompose $H_2$, followed by release into the acting chamber 108. The substrate temperature was maintained at 250° C.

The flow rate ratio of the reactive starting gases at this time were changed as 10/100, 20/100, 30/100, 40/100, 50/100 of $F_2$ gas flow rate/$SiF_4$ decomposed gas (unit is SCCM), and a pressure of 0.5 Torr was maintained for 1 hour for each case, whereby the films having the properties as shown in Table 1A were deposited. Of the respective samples, when drift mobility was measured for Nos. A-2, 3 and 4, it was found to be 21 for Nos. A-2, 35 for Nos. A-3 and 12 cm$^2$/V sec for No. A-4. Thus it has been found that a very good polycrystalline film with strong orientability can be prepared.

In No. A-5 with great $F_2$ flow rate, the film becomes amorphous. The grain size was measured according to the Debye-Scherrar method and by use of a transmission electron microscope.

EXAMPLE 2

By means of the same device as used in Example 1, a film was deposited on a flat plate Corning #7059 base plate as the substrate by introducing excited species of $Si_2F_6$ as the source into the introducing pipe 102 and introducing excited species of $H_2$ into the introducing pipe 103.

By use of $Si_2F_6$ as the starting gas for formation of radicals containing silicon and halogen, this was permitted to flow into the reaction furnace maintained at 800° C. to be decomposed, followed by release from the introducing pipe 102 into the acting chamber 108. At the same time, $F_2$ was permitted to flow through the introducing pipe 111, and discharging was effected by introducing microwave of 2.45 GHz at a power of 0.7 W/cm$^2$, and the discharged product was released into the acting chamber 113. $H_2$, gas was permitted to flow through the introducing pipe 103, discharging was effected by introducing pipe 103, discharging was effected by introducing microwave of 2.45 GHz at a power of 0.5 W/cm$^2$ to decomposed product was released into the acting chamber 108. The substrate temperature was maintained at 310° C.

At this time, the flow rate ratios of the respective starting gases were changed as 5/100, 15/100 25/100, 35/100, 50/100 of $H_2$ gas flow rate/$Si_2F_6$ decomposed gas (unit is SCCM), with $H_2$ being made constant 30 SCCM, and a pressure of 0.5 Torr was maintained for 1 hour under the respective conditions, whereby the films having the properties as shown in Table 2A were deposited. For the respective samples Nos. A-8 and A-9, drift mobility was measured, and a high value of 40.15 cm$^2$/V sec was obtained for each sample. Thus, it has been found that good film was deposited.

EXAMPLE 3

Figure 2:
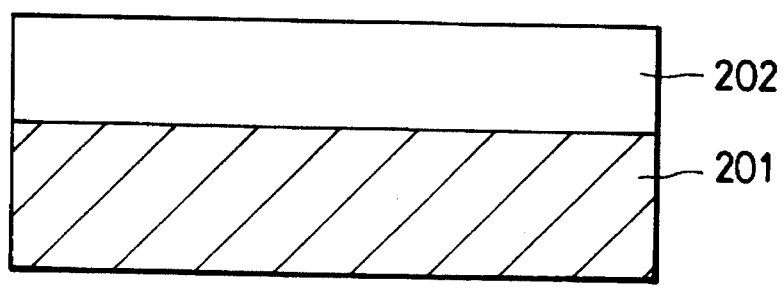
FIG. 2 is a schematic sectional view of the substrate having a deposited film formed according to the process of the present invention.
Figure 3:
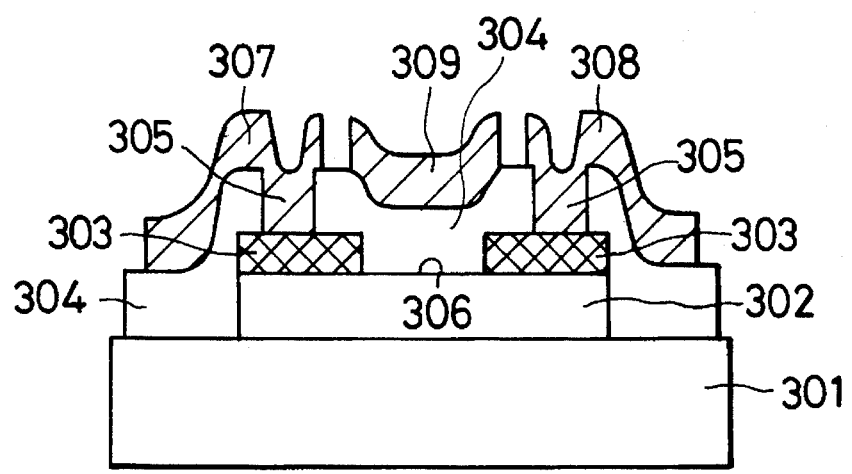
FIG. 3 is a schematic constitutional view of the thin film transistor formed utilizing a deposited film formed according to the process of the present invention.

By use of a semiconductor film prepared under the same conditions as in samples Nos. A-3, A-8 in Examples 1 and 2, a thin film transistor (hereinafter abbreviated as TFT) as shown in FIG. 3 was prepared. After deposition of a Si semiconductor polycrystalline layer 202 as shown in FIG. 2 with a film thickness of 0.5 μm on a glass (Coring #7059) base plate 201 under the above conditions, a TFT was prepared by use of the process for preparation of the upper gate coplanar TFT.

First, according to the glow discharge method, a n+ layer (specific resistivity σ≈1 Ω·cm) which is the ohmic contact layer 303 doped with P was deposited to a thickness of 1000 Å, and then an active layer 302 was remained by photolithography, followed by etching of the channel portion 306 to form the above contact layer 303.

Then, by use of the glow discharge method, $NH_3$ and $SiH_4$ were decomposed to deposit a Si—N—H film with a film thickness of 3000 Å, dielectric constant of 6.7 and a dielectric strength $3\times10^6$ V/cm $V_{FB}\approx0$ V as the insulating layer 304 at a substrate temperature of 200° C. Then, contact holes for source and drain are opened, Al was deposited to 5000 Å by vaccum vapor deposition as the upper electrode, and the source electrode 307, the gate electrode 309 and the drain electrode 308 were respectively formed by photolithography. (The gate width W and the gate length L were respectively 600μ and 20μ.) (The respective TFT samples are referred to as Nos. 3A and 8A.) The characteristics when the drain electrode 308 was earthed and various ⊕ voltages were applied on the source electrode 307 and the gate electrode 309 were measured. In the drain current $I_D$–drain voltage $V_D$ characteristic, good saturation characteristics were obtained in both Nos. 3A and 8A to give a high current of $3\times10^{-4}$ A at a gate voltage of 10 V and a drain voltage of 10 V. The TFT characteristics obtained from the results of measurement of the drain current $I_D$ at various gate voltage $V_D$ are shown in Table 3A.

The TFT by use of the film as obtained above was found to have good characteristics.

Some examples are shown below where heating or irradiation with electromagnetic wave such as light or microwave or with electron beam is utilized. First, method for preparing each sample are summarized below.

A silicon thin film was formed on a substrate of a flat plate glass substrate (#7059, produced by Corning Co.) by means of the device shown in FIG. 1.

By use of $SiF_4$ gas as the starting gas for formation of radicals containing silicon and halogen, this was permitted to flow into the reaction furnace maintained at 1100° C. to be decomposed, followed by release through the introducing pipe 102 into the acting chamber 108. At the same time, $H_2$ gas was permitted flow into the introducing pipe 103 and a microwave of 2.45 GHz was introduced at a power of 0.5 W/cm$^2$ into said introducing pipe 3 to effect discharging to decompose $H_2$, followed by release into the acting chamber 108. The substrate temperature was maintained at 250° C.

Further, at the same time $F_2$ was permitted to flow through the introducing pipe 111, and microwave of 2.45 GHz was discharged at a power of 0.7 W/cm$^2$, followed by release into the acting chamber 113.

By varying the flow rate ratios of $F_2/Si_2F_6$ as 5/100, 20/100, 30/100, 60/100, 80/100 (unit SCCM), and a pressure of 0.5 Torr was maintained for 1 hour in each case to obtain the films having the characteristics as shown in Table 1B.

EXAMPLE 4

First, as shown in Example 2, under the same condition as in sample No. B-3, a polycrystalline film 202 (1000 Å of film thickness) was formed on a glass substrate 201. A polycrystalline film with the great grain size and best orientation is prepared to be subjected to the following treatment.

Figure 4:
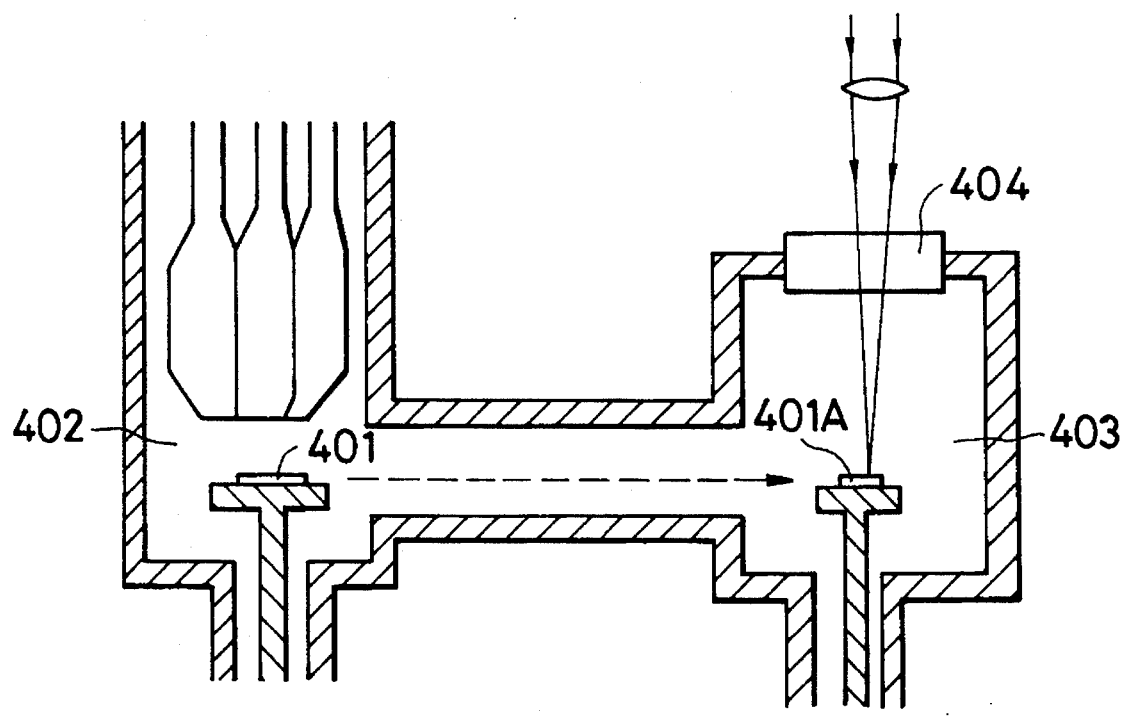
FIG. 4 is a schematic illustration showing the main part of another example of a device for forming a deposited film for embodying the process for forming a deposited film of the present invention is applicable.

The substrate sample No. B-3 was delivered from the reaction chamber 402 to the annealing chamber 403 as shown in FIG. 4, and annealing was effected at a substrate temperature of 200° C. in $H_2$ of 0.2 Torr by use of Ar ion laser, through the quarts window 404, at an output of 1 W at a scanning speed of 50 cm/sec with a beam diameter on the sample of 50 μm with a pitch of scanning of 35 μm. As the result, the crystal grain size was enlarged from 2300 Å on an average to 2 μm on an average. Also, according to X-ray diffraction measurement, the intensity of peak at the orientation face of (2,2,0) corresponding to the face direction (1,1,0) was increased to 5-fold or more.

Figure 5:
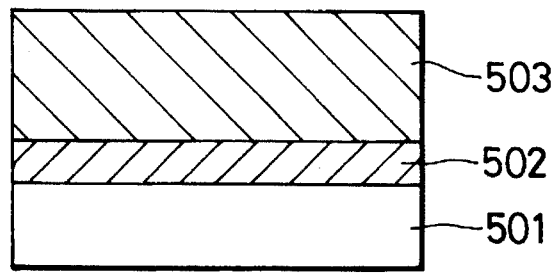
FIG. 5 is a schematic illustration of another deposited film prepared according to the present invention.

Further, the sample after completion of annealing was returned to the reaction chamber 402, and a polycrystalline film 503 was deposited to 4000 Å on a polycrystalline film 502 under the same condition at in the sample No. B-3 in the same Table 1B as described above. This is shown in FIG. 5. In FIG. 5, 501 and 502 correspond to 201 and 202, respectively. As the result, a polycrystalline film 503 with an average grain size of 3 μm was obtained. The film surface was flat with unevenness difference of 100 Å or less, and the drift mobility was measured to be 330 $cm^2/v·s$.

EXAMPLE 5

A polycrystalline film of 1000 Å was deposited under entirely the same conditions as in Example 4, i.e. the same condition as in sample No. 3 in Table 1B, and the sample was delivered into the annealing chamber 403, where ArF excimer laser with wavelength of 193 nm and pulse width of 30 nsec was irradiated through the quarts window 404 at 210 $mJ/cm^2$ and 100 pulses onto the sample maintained at 250° C. As the result, the grain size of the polycrystalline film was grown to 1 μm or more on an average. Next, as the result of further deposition of a polycrystalline film of 4000 Å under the same conditions as in Example 4, a polycrystalline film with unevenness of the film surface of 80 Å or less, an average grain size of 1.5 μm or more and mobility of 180 $cm^2/v·s$ was obtained.

EXAMPLE 6

Figure 6:
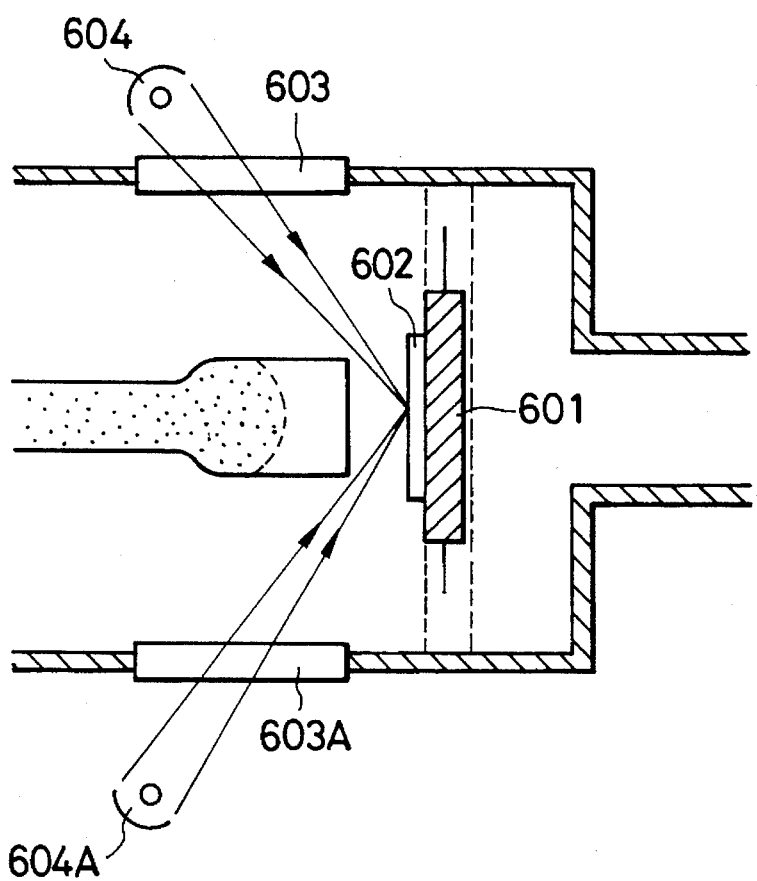
FIG. 6 is a schematic illustration of the main part of still another example of a film forming device for embodying the process of the present invention.

As shown in FIG. 6, on a part of the side wall of the reaction chamber in the experimental device shown in FIG. 1 is mounted a quartz window, a halogen lamp 604 is externally arranged and the device has a structure/function such that the light is condensed onto a straight line on the substrate having a width of 1 mm or less, the width being measured in the direction perpendicular to the moving direction of the substrate which moves on the roller. By means of the device shown in FIG. 1 which is converted as shown in FIG. 6, a polycrystalline film was deposited under the same conditions as in sample No. B-3 in Table 13. During this operation, while the halogen lamp 604 was irradiated simultaneously with deposition and the sample was moved reciprocally by a roller at 2 mm/sec the film was formed. The temperature of the sample surface on which the halogen lamp light was condensed during this operation was 600° C.

According to the above method, a polycrystalline film was deposited to thickness of 5000 Å.

As the result, a polycrystalline film with crystal grain sizes of 3 μm on an average were obtained, with the unevenness on the surface being 100 Å or less and mobility being 380 $cm^2/v·s$.

EXAMPLE 7

In the device shown in FIG. 1, a tungsten wire heater was arranged perpendicularly to the moving direction of the sample by the roller at a distance of 3 mm from the substrate surface.

The wire heater was heated to 850° C., and a polycrystalline film of 5000 Å was deposited on the substrate under the same conditions as in sample No. B-3 in Table 1B, while the sample was moved by the roller at 1.5 mm/sec. As the result, the crystal grain size was 2 μm on an average, the surface unevenness 100 Å or less, and mobility 290 $cm^2/v·s$.

EXAMPLE 8

Figure 7:
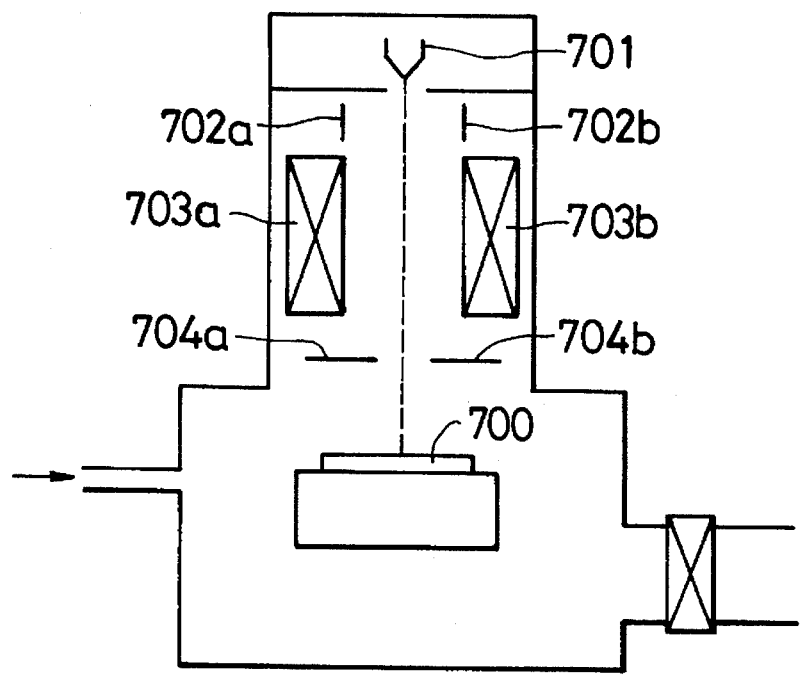
FIG. 7 is a schematic illustration showing the main part of an example of a device using an electron beam in practicing the present invention.

Under the entirely same conditions as in sample No. B-3 in Table 1B, a polycrystalline Si of 5000 Å was formed on a glass substrate. After completion of deposition, the sample was transferred into an electron beam irradiation device shown in FIG. 7. The electrons coming out from the electron gun 701 are irradiated through the deflecting electrodes 703a, b and control electrodes 702a, 702b as accelerated converged beam of electrons on the sample 704.

An electron beam narrowed to a beam current of 2 mA and a beam diameter of 100μ at acceleration voltage of 7 KV was irradiated onto the sample 700 maintained at a substrate temperature of 350° C., and scanned at a scanning speed of 400 mm/sec and a line delivery pitch of 50μ in a reduced pressure of $10^{-7}$. As the result a polycrystalline film with an average crystal grain size of 1 μm, surface unevenness of 200 Å or less and mobility of 160 $cm^2/v·s$ was obtained.

EXAMPLE 9

Figure 8:
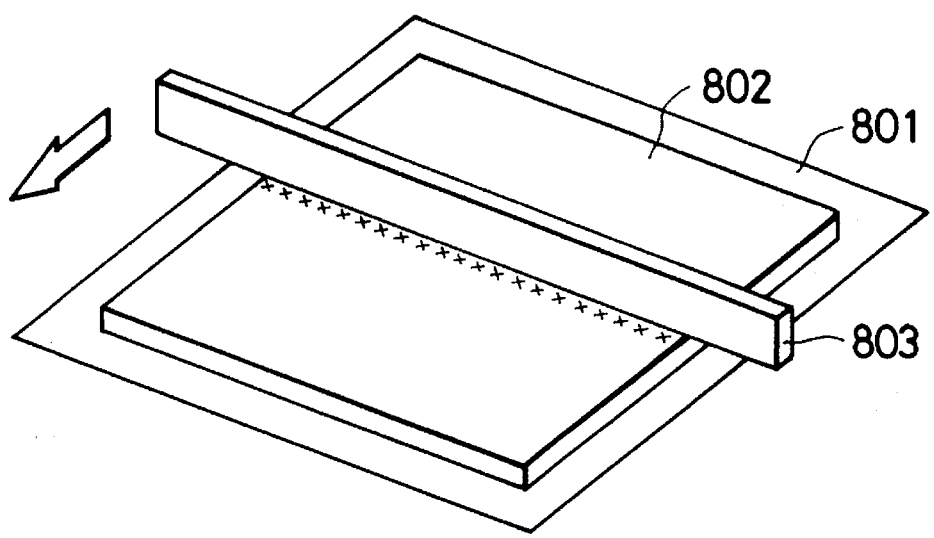
FIG. 8 is a schematic illustration showing the main part of an example of a device using heater in practicing the present invention.

Under the entirely same conditions as in sample No. B-3 in Table 1, polycrystalline Si film of 5000 Å was formed on a glass substrate. The sample 802 was placed on the heater 801 fixed at the lower portion as shown in FIG. 8 in hydrogen gas of 0.1 Torr. While the heater 803 movable at the upper portion was moved at 1 mm/sec, heating was performed. During this operation, the heater fixed at the lower portion was maintained at 600° C., the heater movable at the upper portion at 1100° C. And the distance between the heater movable at the upper portion and the sample 802 surface was made 2 mm. As the result, a polycrystalline film with an average crystal grain size of 1 μm or more, surface unevenness of 150 Å or less and mobility of 180 $cm^2/v·s$ was obtained.

In the above Examples in which treatment to enlarge crystal grain size was carried out by heating or light irradiation, polycrystalline semiconductor Si film was grown on a glass substrate, but it is also possible to form an insulating film such as silicon nitride film, silicon oxide film by the glow discharge method, etc., and permit polycrystalline semiconductor Si film to grow on the insulating film. Also, when annealing is effected after film formation, it is also possible to perform laser annealing, electron beam annealing, etc., only on the semicoductor passage portion after formation of a device such as TFT.

Of course, film forming conditions, various annealing methods, conditions, etc., are not limited to those as shown in the above examples.

EXAMPLE 10

By means of the device shown in FIG. 9 using a flat plate glass substrate (#7059 produced by Corning Co.) as the substrate, a polycrystalline silicon film was formed on said substrate. That is, a substrate (#7059) 903 was placed on a supporting stand 902, and the deposition chamber 901 was internally evacuated by means of an evacuation device to be reduced in pressure to about $10^{-6}$ Torr. $H_2$ gas was introduced from the bomb 906 for gas feeding at 50 sccm through the gas introducing pipe 925 into the activation chamber (B) 923. $H_2$ gas, etc., introduced into the activation chamber (B) was activated by the microwave plasma generating device 922 to be converted to active hydrogen, etc., and the active hydrogen, etc., were introduced through the introducing pipe 924 into the film forming chamber 901.

On the other hand, $SiF_4$ gas was introduced at 20 sccm through the gas introducing pipe 912 into the activation chamber (A) 914 was activated by means of the microwave plasma generating device 913 and introduced through the introducing pipe 912 into the film forming chamber 901. Further, $F_2$ gas was introduced as the etching gas at 10 sccm through the gas introducing pipe 926 into the film forming chamber 901.

While the pressure in the film forming chamber 501 was maintained at 0.02 Torr, the light from the 1 KW Xe lamp was irradiated vertically onto the substrate 503 previously heated to 350° C. by the heater 104 to deposit a polycrystalline silicon film by effecting mutual chemical reaction of the activated species, and at the same time form F* by activation of $F_2$ gas by the above mentioned photoirradiation, thereby effecting etching simultaneously with film formation of said polycrystalline silicon film by utilizing the difference in etching speed depending on the crystal faces, to form a polycrystalline silicon film with a strong orientation in a specific direction. At this time, the difference in etching speed depending on the crystal face was (1,0,0)>(1,1,1)>(1,1,0), whereby a polycrystalline silicon film having (1,1,0) face as the main crystal face was formed. That is, when the formed polycrystalline silicon film was evaluated by X-ray diffraction, the peak intensity at the crystal angle (2θ) of 47.3 degree reflecting the (1,1,0) face exhibited a value which was 7 to 10-fold of the peak intensity at the crystal angles (2θ) of 28.4 degree and 69.2 degree reflecting respectively the (1,1,1) face and (1,0,0) face. Further, the crystal grain size was observed to be 1.2 μm by a transmission type electron microscope.

Also, when the above deposited film was analyzed by FT-IR, a weak peak was recognized in the vinicity of 2000 $cm^{-1}$, and hydrogen content was found to be 0.2 atomic %.

Next, the polycrystalline film sample obtained was placed in a vapor deposition tank, and after formation of a comb-type Al gap electrode (length 250μ, width 5 ml) under an vacuum degree of $10^{-5}$ Torr, dark current was measured at an application voltage of 10 V to determine the dark electroconductivity σd for evaluation of the polycrystalline silicon.

The film forming conditions as described above and the evaluation results of the polycrystalline silicon film are respectively shown in Table 1C and Table 2C.

EXAMPLE 11

Films were formed under the same conditions as in Example 10 except for varying the gas species and flow rates as shown in Table 3C. The evaluation results are shown in Table 4C.

EXAMPLE 12

Films were formed under the same conditions as in Example 10, except for introducing doping gases into the activation space (A) under the conditions shown in Table 5C. The evaluation results are shown in Table 6C.

EXAMPLE 13

Films were formed under the same conditions as in Example 10, except for introducing halogen containing gases into the film forming space under the conditions shown in Table 7C.

The evaluation results are shown in Table 8C.

EXAMPLE 14

Films were formed under the same conditions as in Example 10 except for varying the discharging powers in the activation space (A) and the activation space (B) as shown in Table 9.

The evaluation results are shown in Table 10C.

EXAMPLE 15

Films were formed under the same conditions as in Example 10 except for varying the substrate temperature as shown in Table 11C. The evaluation results are shown in Table 12C.

EXAMPLE 16

Films were formed under the same conditions as in Example 10 except for varying the inner pressure as shown in Table 13C. The evaluation results are shown in Table 14C.

EXAMPLE 17

Films were formed under the same conditions as in Example 10, except for varying the output of light source as shown in Table 15C. The evaluation results are shown in Table 16C.

EXAMPLE 18

Figure 10:
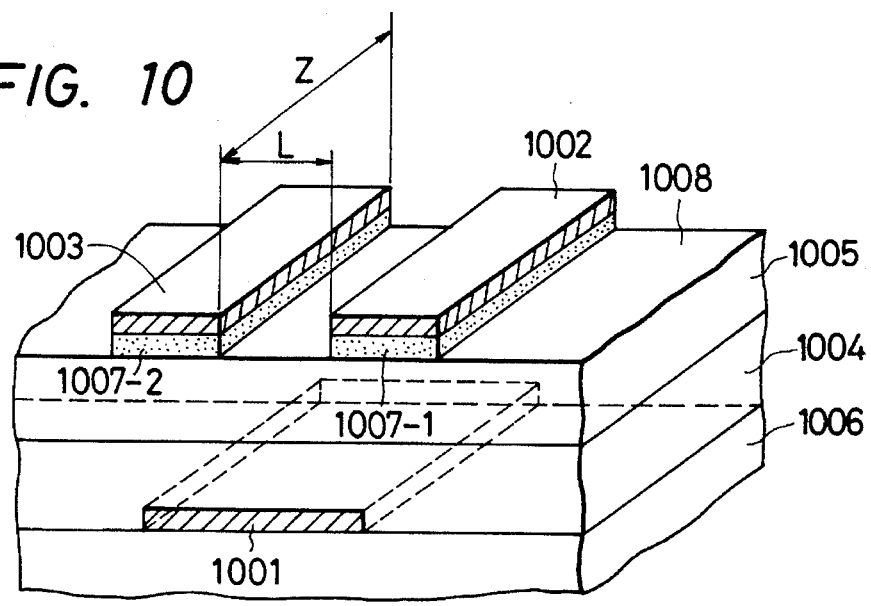
FIG. 10 is a schematic partial perspective view of the thin film transistor formed utilizing a deposited film formed according to the process of the present invention.

FIG. 10 is a schematic partial perspective view showing the structure of a thin film transistor (hereinafter abbreviated as TFT) of which semiconductor part is constituted of a polycrystalline silicon formed according to the method for forming deposited film of the present invention. The polycrystalline silicon TFT 1000 shown in FIG. 10 is constituted to have a structure which is formed by laminating successively a gate electrode 1001, an electrically insulating layer 1004 so as to cover over said gate electrode 1001 on a substrate 1006 comprising glass, ceramic, etc., and a semiconductor layer 1005 comprising a polycrystalline silicon, and on the surface 1008 of the semiconductor layer 1005 are provided a first $n^+$ layer 1007-1 and a second $n^+$ layer 1007-2 in a juxtaposed relationship apart from each other, and further a source electrode 1002 is provided on the first $n^+$ layer 1007-1 and a drain electrode 1003 on the second $n^+$ layer 1007-2, respectively.

The first $n^+$ layer 1007-1 and the second $n^+$ layer 1007-2 provided in contact on the surface (clean surface) 1008 on the semiconductor layer 1005 are formed after formation of the semiconductor layer 1005 without exposing said layer surface 1008 to the atmosphere or oxygen. In this Example, the distance L between the source electrode 1002 and the drain electrode 1003 is 50μ, and the length Z of the source electrode 1002 and the drain electrode 1003 is 10 mm.

The semiconductor layer 1005 in this example was formed under the same condition as sample No. C-1 (which corresponds to C-9-1), C-2-2 (which corresponds to C-9-2).

The characteristics when various ⊕ voltages were applied on the source electrode and the gate electrode with the drain electrode being earthed were measured.

In the drain current $I_D$–drain voltage $V_D$ characteristics, good saturation characteristics were obtained in both Nos. C-9-1, C-9-2, and high current of $5\times10^{-4}$ A was obtained at a gate voltage 10 V and a drain voltage 10 V. The TFT characteristics obtained from the results of measurement of drain current $I_D$ at various gate voltage $V_G$ are shown in Table 17C.

The TFT by use of the polycrystalline silicon film obtained as described above was found to exhibit good characteristics.

EXAMPLE 19

Figure 11:
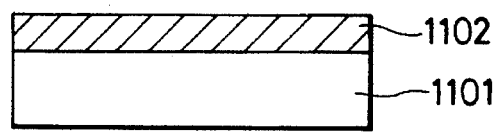
FIG. 11 is a schematic sectional view of a substrate having a deposited film formed thereon according to the process of the present invention.

First, as shown in FIG. 11, a polycrystalline film 12 was deposited to 1000 Å on the glass substrate 1101 according to the process as described above under the conditions in Table 1C.

Figure 12:
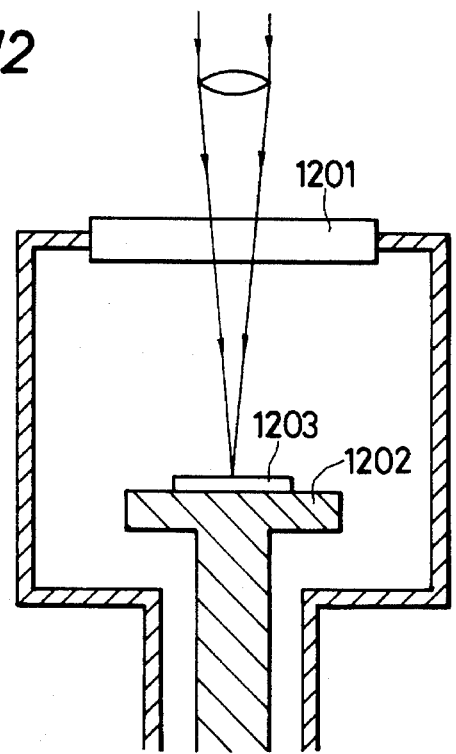
FIG. 12 is a schematic illustration showing the main part of an example of a device using a laser beam in practicing the present invention.

Next, as shown in FIG. 12, Xe lamp was replaced with Ar ion laser, at a substrate temperature of 200° C. by use of Ar ion laser in $H_2$ of 0.2 Torr, through the quartz window 1201, annealing was effected at an output of 1 W with a beam diameter of 50 μm at a scanning speed of 50 cm/sec and a pitch of scanning of 35 μm. As the result, the crystal grain size was enlarged from 2100 Å on an average to 2 μm on an average. Also, according to X-ray diffraction measurement, the intensity peak on the orientation face of (220) was found to be increased to 5-fold or more.

Further, after completion of annealing, Ar ion laser was returned to Xe lamp, and a polycrystalline film was deposited to 4000 Å under the same conditions in Table 1C. The same state as this state of the sample is shown in FIG. 4. As the result, a polycrystalline film with grain sizes of 3 μm or more on an average was obtained. The film surface was flat with a different in unevenness of 100 Å or less, and the drift mobility was measured to be 330 $cm^2/v\cdot s$.

EXAMPLE 20

According to the same conditions as in Example 19, a polycrystalline film 502 of 1000 Å was deposited, and with removal of Xe lamp, ArF excimer laser with a wavelength of 193 nm and a pulse width of 30 nsec was irradiated on a sample maintained at 250° C. at 210 $mJ/cm^2$ and 100 pulses. As the result, the grain size of the polycrystalline film was grown to 1 μm or more on an average. Next, as the result of deposition of a polycrystalline film under the same conditions as in Example 19 to 4000 Å, a polycrystallien film with unevenness of the film surface of 80 Å or less, an average grain size of 1.5 μm or more and a mobility of 180 $cm^2/v\cdot s$ was obtained.

EXAMPLE 21

Figure 13:
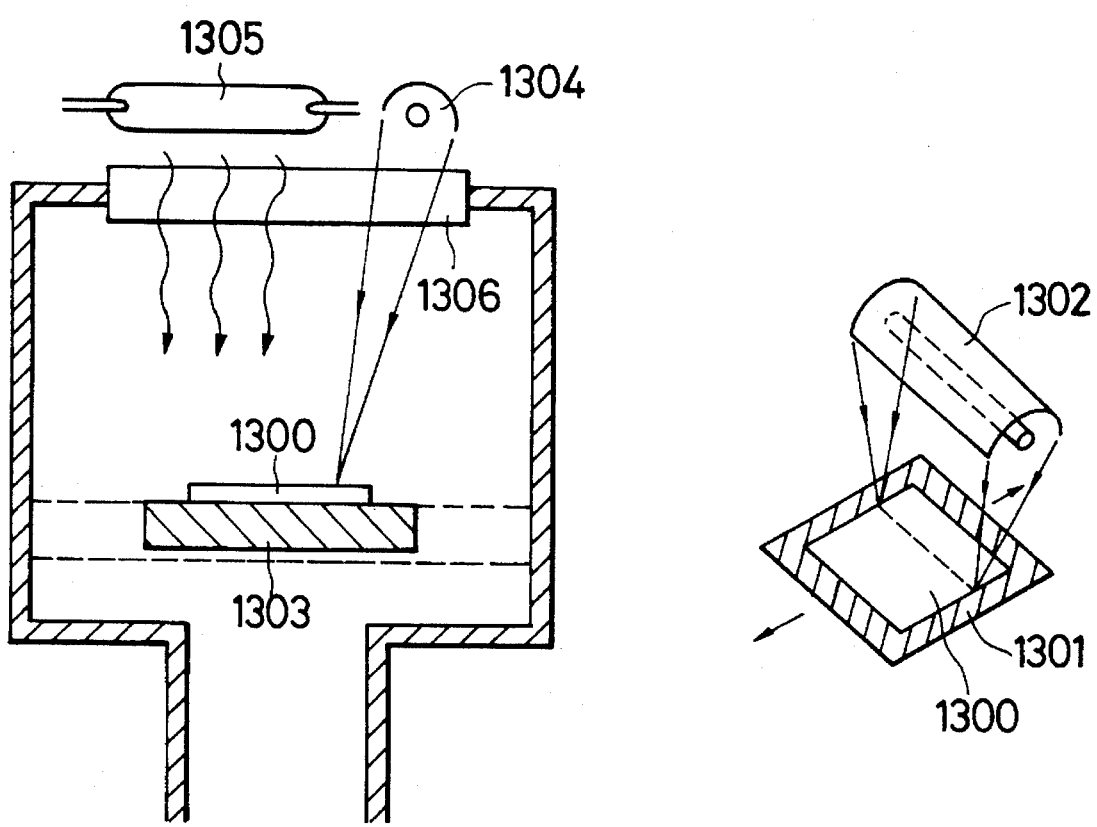
FIG. 13 is a schematic illustration showing the main part of an example of a device using a halogen lamp in combination with a Xe lamp in practicing the present invention.

In the device in FIG. 9, Xe lamp 1301 and halogen lamp 1302 were mounted at the same time, and the halogen lamp light was condensed linearly with a width of 1 mm or less in the direction perpendicular to the moving direction by the roller on the substrate. This is shown in FIG. 13. By means of the device shown in FIG. 5, a polycrystalline film was deposited under the same conditions as in Table 1C. During this operation, the halogen lamp 1302 was irradiated simultaneously with deposition and the sample was moved by a roller at 2 mm/sec. The temperature of the sample surface on which the halogen lamp light was condensed during this operation was 600° C.

According to the above method, the sample was moved reciprocally by the roller to deposit a polycrystalline film of 5000 Å.

As the result, a polycrystalline film with crystal grain sizes of 3 μm on an average were obtained, with the unevenness on the surface being 100 Å or less and mobility being 380 $cm^2/v\cdot s$.

EXAMPLE 22

In the device shown in FIG. 9, a tungsten wire heater was arranged perpendicularly to the moving direction of the sample by the roller at a distance of 3 mm from the substrate surface.

The wire heater was heated to 850° C., and a polycrystalline film of 5000 Å was deposited under the same conditions as in Table 1C in Example 19, while the sample was moved by the roller at 1.5 mm/sec. As the result, the crystal grain size was 2 μm on an average, the surface unevenness 100 Å or less, and mobility 290 $cm^2/v\cdot s$.

EXAMPLE 23

Under the same conditions as in Table 1C in a polycrystalline Si of 5000 Å was formed on a glass substrate. After completion of deposition, the sample was transferred into an electron beam irradiation device shown in FIG. 7. The electrons coming out from the electron gun 701 were irradiated through the deflecting electrodes 703a, b and control electrodes 702a, b and 704a, b as accelerated converged beam of electrons on the sample.

An electron beam narrowed to a beam current of 2 mA and a beam diameter of 100μ at acceleration voltage of 7 KV was irradiated onto the sample maintained at a substrate temperature of 350° C., and scanned at a scanning speed of 400 mm/sec and a line delivery pitch of 50μ in a reduced pressure of $10^{-7}$. As the result, a polycrystalline film with an average crystal grain size of 1 μm, surface unevenness of 200 Å or less and mobility of 160 $cm^2/v\cdot s$ was obtained.

EXAMPLE 24

Under the entirely same conditions as in Table 1C, a polycrystalline Si film of 5000 Å was formed on a glass substrate, and then with the sample 802 being placed on the heater 801 fixed at the lower portion as shown in FIG. 8 in hydrogen gas of 0.1 Torr, the heater 803 movable at the upper portion was moved at 1 mm/sec. During this operation, the heater fixed at the lower portion was maintained at 600° C., the heater movable at the upper portion at 1100° C. And the distance between the heater movable at the upper portion and the sample surface was made 2 mm. As the result, a polycrystalline film with an average crystal grain size of 1 μm or more, surface unevenness of 150 Å or less and mobility of 180 $cm^2/v\cdot s$ was obtained.

TABLE 1A

| Sample No. | A-1 | A-2 | A-3 | A-4 | A-5 |
| --- | --- | --- | --- | --- | --- |
| $F_2$ gas flow rate (SCCM)/$SiF_4$ gas | 5/100 | 20/100 | 30/100 | 60/100 | 80/100 |

TABLE 1A-continued

| Sample No. | A-1 | A-2 | A-3 | A-4 | A-5 |
|---|---|---|---|---|---|
| flow rate (SCCM) | | | | | |
| Peak intensity ratio 220/111 of diffraction by X-ray | 10/0 | 40/0 | 100/0 | 100/20 | 0/0 |
| Grain size (Å) | 80 | 1200 | 2300 | 500 | 0 |
| Deposition Sheet (Å/sec) | 5.0 | 10.4 | 3.0 | 1.0 | 1.0 |

TABLE 2A

| Sample No. | A-6 | A-7 | A-8 | A-9 | A-10 |
|---|---|---|---|---|---|
| $F_2$ gas flow rate (SCCM)/SiF$_4$ gas flow rate (SCCM) | 5/100 | 15/100 | 25/100 | 35/100 | 50/100 |
| Peak intensity ratio 220/111 of diffraction by X-ray | 9/8 | 80/10 | 100/0 | 50/0 | 30/0 |
| Grain size (Å) | 30 | 500 | 2400 | 1100 | 750 |
| Deposition sheet (Å/sec) | 11.0 | 10.0 | 8.0 | 5.0 | 2.0 |

TABLE 3A

| Sample No. | A-3 | A-8 |
|---|---|---|
| Ratio of the maximum value and the minimum value of drain | $2 \times 10^5$ | $3 \times 10^5$ |
| Electrical field effect mobility** (cm$^2$/V · sec) | 28 | 39 |
| Threshold value voltage** (V) | 5.4 | 3.2 |

*Measured by varying gate voltage (drain voltage $V_D = 10$ V made constant)
**Calculated from $\sqrt{I_D} = 1$

TABLE 1B

| Sample No. | B-1 | B-2 | B-3 | B-4 | B-5 |
|---|---|---|---|---|---|
| $F_2$ gas flow rate (SCCM)/SiF$_4$ gas flow rate (SCCM) | 5/100 | 20/100 | 30/100 | 60/100 | 80/100 |
| Peak intensity ratio 110/111 of diffraction by X-ray | 10/0 | 40/0 | 100/0 | 100/20 | 0/0 |
| Grain size (Å) | 80 | 1200 | 2300 | 500 | 0 |
| Deposition rate (Å/sec) | 5.0 | 10.4 | 3.0 | 1.0 | 1.0 |

Peak intensity ratio reflecting the diffraction peak intensities of the respective crystal faces (220), (111), (400) by X-ray diffraction and I/Io ratio of ASTM card

TABLE 1C

| | Gas species | Flow rate (SCCM) | Discharging power (W) | Substrate temperature (°C.) | Inner pressure (Torr) | Light source | Film forming rate (Å/S) |
|---|---|---|---|---|---|---|---|
| Activation space (A) | SiF$_4$ | 20 | 500 | 350 | 0.02 | Xe lamp 1 KW | 2 |
| Activation space (B) | H$_2$ | 50 | 200 | | | | |
| Etching conditions | F$_2$ | 10 | | | | | |

TABLE 2C

| | | X-ray diffraction | | Crystal grain size | H content |
|---|---|---|---|---|---|
| Sample | σd(℧cm$^{-1}$) | (2,2,0)/(1,1,1) | (2,2,0)/(4,0,0) | (μm) | (atomic %) |
| C.1 | $1.1 \times 10^{-5}$ | 7/1 | 10/1 | 1.2 | 0.2 |

*In Table 2, the ratios of (2,2,0)/(1,1,1) and (200)/(400) are peak intensity ratios of the respective crystal faces by X-ray diffraction and in view of I/I$_0$ ratio of ASTM card.

TABLE 3C

|  |  | Sample No. | | | | | | |
| --- | --- | --- | --- | --- | --- | --- | --- | --- |
|  |  | C-2-1 | C-2-2 | C-2-3 | C-2-4 | C-2-5 | C-2-6 | |
| Activation space (A) | Gas species | $Si_2F_6$ | $SiH_2F_2$ | $SiCl_4$ | $SiH_2Cl_2$ | $SiF_4$ | Ar | $SiF_4$ |
|  | Flow rate (SCCM) | 10 | 20 | 20 | 20 | 20 | 50 | 20 |
| Activation space (B) | Gas species | $H_2$ | $H_2$ | $H_2$ | $H_2$ | $H_2$ | Ar | $H_2$ |
|  | Flow rate (SCCM) | 50 | 30 | 50 | 30 | 50 | 50 | 50 |
| Etching gas | Gas species | $F_2$ | $F_2$ | $F_2$ | $F_2$ | $F_2$ | $Cl_2$ | |
|  | Flow rate (SCCM) | 10 | 10 | 10 | 10 | 10 | 10 | |

TABLE 4C

| Sample No. | σd ($\mho cm^{-1}$) | X-ray diffraction (2,2,0)/(1,1,1) | (2,2,0/4,0,0) | Crystal grain size (μm) | H content (atomic %) |
| --- | --- | --- | --- | --- | --- |
| C-2-1 | $7.0 \times 10^{-6}$ | 6/1 | 8/1 | 1.0 | 0.5 |
| C-2-2 | $3.1 \times 10^{-5}$ | 12/1 | 20/1 | 1.3 | 0.3 |
| C-2-3 | $9.0 \times 10^{-6}$ | 8/1 | 12/1 | 0.8 | 0.2 |
| C-2-4 | $2.0 \times 10^{-5}$ | 10/1 | 14/1 | 1.1 | 0.3 |
| C-2-5 | $1.0 \times 10^{-5}$ | 8/1 | 11/1 | 1.2 | 0.1 |
| C-2-6 | $1.4 \times 10^{-5}$ | 8/1 | 12/1 | 1.2 | 0.2 |

TABLE 5C

|  |  | Sample No. | | | |
| --- | --- | --- | --- | --- | --- |
|  |  | C-3-1 | C-3-2 | C-3-3 | C-3-4 |
| Activation space (A) | Gas species flow rate (SCCM) | $SiF_4$ 20 | $SiF_4$ 20 | $SiF_4$ 20 | $SiF_4$ 20 |
|  | Doping Gas species (ppm) | $BF_3$ 100 | $BF_3$ 500 | $PF_5$ 100 | $PF_5$ 500 |

*Concentration is flow rate ratio of doping gas and starting gas ($SiF_4$ gas), and each doping gas is diluted to 3000 ppm with hydrogen

TABLE 7C

|  | Sample No. | | | | |
| --- | --- | --- | --- | --- | --- |
|  | C-4-1 | C-4-2 | C-4-3 | C-4-4 | C-4-5 |
| Gas species flow rate (SCCM) | $F_2$ 0 | $F_2$ 5 | $F_2$ 10 | $F_2$ 50 | $F_2$ 100 |

TABLE 6C

| Sample No. | σd ($\mho cm^{-1}$) | X-ray diffraction (2,2,0)/(1,1,1) | (2,2,0/4,0,0) | Crystal grain size (μm) | H content (atomic %) |
| --- | --- | --- | --- | --- | --- |
| C-3-1 | $2.0 \times 10^{-3}$ | 7/1 | 10/1 | 1.2 | 0.2 |
| C-3-2 | $8.0 \times 10^{-3}$ | 8/1 | 12/1 | 1.3 | 0.3 |
| C-3-3 | $1.3 \times 10^{-3}$ | 7/1 | 10/1 | 1.2 | 0.2 |
| C-3-4 | $7.0 \times 10^{-3}$ | 8/1 | 12/1 | 1.4 | 0.3 |

TABLE 8C

| Sample No. | σd (℧cm⁻¹) | X-ray diffraction (2,2,0)/(1,1,1) | X-ray diffraction (2,2,0)/(4,0,0) | Crystal grain size (μm) | H content (atomic %) |
|---|---|---|---|---|---|
| C-4-1 | $4.0 \times 10^{-6}$ | 2/1 | 3/1 | 0.3 | 0.6 |
| C-4-2 | $7.0 \times 10^{-6}$ | 4/1 | 6/1 | 0.5 | 0.4 |
| C-4-3 | $9.0 \times 10^{-6}$ | 6/1 | 8/1 | 0.9 | 0.3 |
| C-4-4 | $1.3 \times 10^{-5}$ | 10/1 | 15/1 | 1.5 | 0.06 |
| *C-4-5 | — | — | — | — | — |

*No film was formed in Sample C-4-5 and Si wafer for IR analysis was etched.

TABLE 9C

| | | C-5-1 | C-5-2 | C-5-3 | C-5-4 | C-5-5 | C-5-6 | C-5-7 | C-5-8 |
|---|---|---|---|---|---|---|---|---|---|
| Discharging power in (A) | (W) | 100 | 300 | 700 | 1000 | 500 | 500 | 500 | 500 |
| Discharging power in (B) | (W) | 200 | 200 | 200 | 200 | 50 | 100 | 300 | 500 |

TABLE 10C

| Sample No. | σd (℧cm⁻¹) | X-ray diffraction (2,2,0)/(1,1,1) | X-ray diffraction (2,2,0)/(4,0,0) | Crystal grain size (μm) | H content (atomic %) |
|---|---|---|---|---|---|
| C-5-1 | $3.0 \times 10^{-6}$ | 4/1 | 5/1 | 0.7 | 0.6 |
| C-5-2 | $5.0 \times 10^{-6}$ | 5/1 | 8/1 | 0.8 | 0.4 |
| C-5-3 | $2.0 \times 10^{-6}$ | 9/1 | 13/1 | 1.2 | 0.1 |
| C-5-4 | $9.0 \times 10^{-5}$ | 7/1 | 10/1 | 1.2 | 0.05 |
| C-5-5 | $5.0 \times 10^{-6}$ | 5/1 | 7/1 | 0.8 | 0.05 |
| C-5-6 | $9.0 \times 10^{-6}$ | 6/1 | 9/1 | 1.0 | 0.1 |
| C-5-7 | $1.2 \times 10^{-5}$ | 7/1 | 10/1 | 1.2 | 0.3 |
| C-5-8 | $9.0 \times 10^{-6}$ | 7/1 | 10/1 | 1.1 | 0.4 |

TABLE 11C

| | C-6-1 | C-6-2 | C-6-3 | C-6-4 | C-6-5 |
|---|---|---|---|---|---|
| Substrate temperature (°C.) | 50 | 150 | 250 | 450 | 650 |

TABLE 13C

| | C-7-1 | C-7-2 | C-7-3 | C-7-4 | C-7-5 |
|---|---|---|---|---|---|
| Inner pressure (Torr) | 0.0001 | 0.001 | 0.01 | 0.1 | 1.0 |

TABLE 12C

| Sample No. | σd (℧cm⁻¹) | X-ray diffraction (2,2,0)/(1,1,1) | X-ray diffraction (2,2,0)/(4,0,0) | Crystal grain size (μm) | H content (atomic %) |
|---|---|---|---|---|---|
| C-6-1 | $2.1 \times 10^{-7}$ | 1/1 | 2/1 | 0.1 | 5.0 |
| C-6-2 | $9.0 \times 10^{-7}$ | 2/1 | 4/1 | 0.3 | 2.0 |
| C-6-3 | $5.0 \times 10^{-6}$ | 4/1 | 7/1 | 0.8 | 0.8 |
| C-6-4 | $1.0 \times 10^{-5}$ | 10/1 | 12/1 | 1.4 | 0.1 |
| C-6-5 | $8.0 \times 10^{-6}$ | 12/1 | 15/1 | 1.8 | *— |

*H was not detected.

TABLE 14C

| Sample No. | σd ($\mho cm^{-1}$) | X-ray diffraction (2,2,0)/(1,1,1) | (2,2,0)/(4,0,0) | Crystal grain size (μm) | H content (atomic %) |
|---|---|---|---|---|---|
| C-7-1 | $3.0 \times 10^{-5}$ | 8/1 | 15/1 | 1.3 | 0.07 |
| C-7-2 | $2.0 \times 10^{-5}$ | 7/1 | 13/1 | 1.2 | 0.1 |
| C-7-3 | $1.5 \times 10^{-5}$ | 7/1 | 10/1 | 1.2 | 0.2 |
| C-7-4 | $8.0 \times 10^{-6}$ | 6/1 | 8/1 | 0.8 | 0.7 |
| C-7-5 | $4.0 \times 10^{-6}$ | 5/1 | 7/1 | 0.5 | 1.5 |

TABLE 15C

| | Sample No. | | | |
|---|---|---|---|---|
| | C-8-1 | C-8-2 | C-8-3 | C-8-4 |
| Xe lamp output (W) | 0.1 | 0.5 | 2.0 | 3.0 |

TABLE 16C

| Sample No. | σd ($\mho cm^{-1}$) | X-ray diffraction (2,2,0)/(1,1,1) | (2,2,0)/(4,0,0) | Crystal grain size (μm) | H content (atomic %) |
|---|---|---|---|---|---|
| C-8-1 | $4.0 \times 10^{-6}$ | 5/1 | 7/1 | 0.4 | 1.0 |
| C-8-2 | $7.0 \times 10^{-6}$ | 6/1 | 8/1 | 0.8 | 0.6 |
| C-8-3 | $1.0 \times 10^{-5}$ | 8/1 | 12/1 | 1.5 | 0.1 |
| C-8-4 | $1.1 \times 10^{-5}$ | 10/1 | 12/1 | 1.5 | 0.06 |

TABLE 17C

| | Sample Nos. | |
|---|---|---|
| | C-9-1 | C-9-2 |
| Ratio of maximum value to minimum value of drain current* | $5 \times 10^5$ | $8 \times 10^5$ |
| Electrical filed effect mobility ($cm^2/v\ sec$)** | 150 | 180 |
| Threshold value voltage | 2.0 | 1.4 |

*measured by varying gate voltage (drain voltage $V_D = 10$ V constant)
**calculated from $\sqrt{I_D} - V_G$ dependency

We claim:

1. A process for forming a silicon containing polycrystalline deposited film on a substrate in a reaction space comprising:
   (a) forming activated species (A) in an activation space (A) by decomposition of a compound (SX) containing silicon and at least one halogen, where said compound (SX) is a compound selected from the group consisting of chain silicon halides represented by $Si_u Y_{2u+2}$, cyclic silicon halides represented by $Si_v Y_{2v}$, and a chain or a cyclic compound represented by $Si_u H_x Y_y$, where u is an integer of 1 or more, v is a integer of 3 or more, x+y=2u+2, and Y is at least one element selected from F, cl, Br and I;
   (b) forming activated species (B) in an activation space (B) which is separate from the activation space (A), the activated species (B) formed from a chemical substance (B) selected from the group consisting of $H_2$ gas and halogen gas which is chemically reactive with said activated species (A) to effect film formation;
   (c) forming the deposited film by reacting both of the activated species consisting essentially of the activated species (A) and the activated species (B) by introducing the activated species (A) and the activated species (B) into the reaction space wherein a flow rate ratio of said activated species (A) to said activated species (B) during said introducing is 10:1 to 1:10 such that said both activated species mix and chemically react with each other in the vicinity of the substrate to deposit said film thereon;
   (d) exposing the film during film deposition to a gaseous substance (E) to etch the surface of the deposited film and thereby effecting crystal growth of polycrystals in a specific face direction; and
   (e) irradiating the substrate and said gaseous substance (E) with photo-energy to increase etchant activity and to increase the polycrystals in grain size, wherein said polycrystalline deposited film is formed without use of an exciting plasma in the film forming space.

2. The process according to claim 1, wherein either one of hydrogen and halogen is used in addition to said compound (SX) during the decomposition of said compound (SX).

3. The process according to claim 1, wherein a compound containing a dopant is used together with said compound (SX) during formation of said activated species (A) to from a doped polycrystalline deposited film.

4. The process according to claim 1, wherein a compound containing a dopant is used together with said chemical substance (B) during formation of said activated species (B) to form a doped polycrystalline deposited film.

5. The process according to claim 1, wherein an activated species (D) formed from a compound containing a dopant is introduced into said film forming space.

6. The process according to claim 1 wherein the gaseous substance (E) is selected from the group consisting of halogen gas, halide gas, and activated species (C) formed therefrom.

* * * * *

UNITED STATES PATENT AND TRADEMARK OFFICE
CERTIFICATE OF CORRECTION

PATENT NO.  : 5,591,492

DATED       : January 7, 1997

INVENTORS   : YUTAKA HIRAI ET AL.

It is certified that error appears in the above-identified patent and that said Letters Patent is hereby corrected as shown below:

ON TITLE PAGE

[56] References Cited/OTHER PUBLICATIONS

Under L. Jastrzebski, "SiO2" should read --$SiO_2$-- and under K. Tanno et al., "Epitoxy" should read --Epitaxy--.

COLUMN 1

Line 37, "of" should be deleted;
   Line 38, "its" should read --the--;
   Line 39, "existed" should read --exist--;
   Line 42, "format" should read --forma- --;
   Line 43, "ion," should read --tion--.

COLUMN 2

Line 24, "deposted" should read --deposited--;
   Line 42, "is applicable" should be deleted;
   Line 53, "heater" should read --a heater--.

COLUMN 3

Line 46, "direction" should read --direction,--.

UNITED STATES PATENT AND TRADEMARK OFFICE
CERTIFICATE OF CORRECTION

PATENT NO. : 5,591,492

DATED : January 7, 1997

INVENTORS : YUTAKA HIRAI ET AL.

It is certified that error appears in the above-identified patent and that said Letters Patent is hereby corrected as shown below:

COLUMN 4

Line 65, "preferably" should read --preferable--;
Line 67, "film" should be deleted.

COLUMN 5

Line 2, "pCl$_3$," should read --PCl$_3$--;
Line 5, "element" should read --elements--.

COLUMN 6

Line 47, "said" should be deleted.

COLUMN 7

Line 22, "damages suffered" should read --damage--;
Line 33, "rendered" should read --is rendered--.

COLUMN 8

Line 4, "sidiarilly" should read --sidiarily--;
Line 47, "device" should read --devices--.

UNITED STATES PATENT AND TRADEMARK OFFICE
CERTIFICATE OF CORRECTION

PATENT NO.  : 5,591,492

DATED       : January 7, 1997

INVENTORS   : YUTAKA HIRAI ET AL.

It is certified that error appears in the above-identified patent and that said Letters Patent is hereby corrected as shown below:

COLUMN 9

Line 6,   "(#7059)," should read --(#7059,--;
   Line 15,  "pipe 3" should read --pipe 103--;
   Line 18,  "ratio" should read --ratios--;
   Line 26,  "Nos. A-2," should read --No. A-2,-- and "Nos. A-3" should read --No. A-3--;
   Line 49,  "$H_2$," should read --$H_2$--;
   Line 53,  "to decomposed" should read --. Decomposed--;
   Line 58,  "15/100" should read --15/100,--.

COLUMN 10

Line 7,   "(Coring" should read --(Corning--;
   Line 14,  "remained" should read --exposed--;
   Line 23,  "vaccum" should read --vacuum--;
   Line 35,  "voltage" should read --voltages--;
   Line 41,  "method" should read --methods--;
   Line 51,  "flow" should read --to flow--;
   Line 53,  "pipe 3" should read --pipe 103--.

UNITED STATES PATENT AND TRADEMARK OFFICE
CERTIFICATE OF CORRECTION

PATENT NO. : 5,591,492

DATED : January 7, 1997

INVENTORS : YUTAKA HIRAI ET AL.

It is certified that error appears in the above-identified patent and that said Letters Patent is hereby corrected as shown below:

COLUMN 11

Line 9, "quarts" should read --quartz--;
  Line 20, "at" should read --as--;
  Line 36, "quarts" should read --quartz--.

COLUMN 12

Line 2, "were" should read --was--;
  Line 21, "Si" should read --Si film--;
  Line 33, "result" should read --result,--.

COLUMN 13

Line 24, "chamber 501" should read --chamber 901--;
  Line 26, "substrate 503" should read --substrate 903--;
  Line 27, "heater 104" should read --heater 904--;
  Line 30, "above mentioned" should read --above-;
           mentioned--;
  Line 52, "an" should read --a--.

UNITED STATES PATENT AND TRADEMARK OFFICE
CERTIFICATE OF CORRECTION

PATENT NO. : 5,591,492

DATED : January 7, 1997

INVENTORS : YUTAKA HIRAI ET AL.

It is certified that error appears in the above-identified patent and that said Letters Patent is hereby corrected as shown below:

COLUMN 15

Line 14, "voltage $V_G$" should read --voltages $V_G$--;
Line 22, "film 12" should read --film 1102--;
Line 42, "different" should read --difference--;
Line 48, "film 502" should read --film 1102--;
Line 55, "polycrystallien" should read --polycrystalline--.

COLUMN 16

Line 11, "were" should read --was--;
Line 29, "Table 1C in" should read --Table 1C,--;
Line 30, "Si" should read --Si film--.

COLUMN 18

Table 2C "(200)/(400)" should read --(2,2,0)/(4,0,0)--.

UNITED STATES PATENT AND TRADEMARK OFFICE
CERTIFICATE OF CORRECTION

PATENT NO. : 5,591,492

DATED : January 7, 1997

INVENTORS : YUTAKA HIRAI ET AL.

It is certified that error appears in the above-identified patent and that said Letters Patent is hereby corrected as shown below:

<u>COLUMN 21</u>

Table 10C "$5.0 \times 10^{-6}$" (1st occur.) should read --$7.0 \times 10^{-6}$--.

<u>COLUMN 25</u>

Line 42, "filed" should read --field--;
Line 60, "cl," should read --Cl,--.

<u>COLUMN 26</u>

Line 51, "from" should read --form--;
Line 58, "an" should be deleted.

Signed and Sealed this

Twelfth Day of August, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.  : 5,591,492
DATED       : January 7, 1997
INVENTOR(S) : YUTAKA HIRAI ET AL.

It is certified that error appears in the above-identified patent and that said Letters Patent is hereby corrected as shown below:

COLUMN 17

Line 18, Table 2A, "$SiF_4$" should read --$Si_2F_6$--.

Signed and Sealed this

Twenty-first Day of October 1997

Attest:

BRUCE LEHMAN

Attesting Officer

Commissioner of Patents and Trademarks